(12) United States Patent
Kochanowski et al.

(10) Patent No.: US 6,566,611 B2
(45) Date of Patent: May 20, 2003

(54) ANTI-TOMBSTONING STRUCTURES AND METHODS OF MANUFACTURE

(75) Inventors: Michael Kochanowski, Portland, OR (US); Mandy G. Terhaar, Tualatin, OR (US); Cheryl M. Floyde, Aloha, OR (US); George Hsieh, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/964,234

(22) Filed: Sep. 26, 2001

(65) Prior Publication Data

US 2003/0056975 A1 Mar. 27, 2003

(51) Int. Cl.[7] .......................... H01R 12/04; H05K 1/11
(52) U.S. Cl. ........................................ 174/261; 174/260
(58) Field of Search .................. 174/260, 261; 361/767–771; 29/847

(56) References Cited

U.S. PATENT DOCUMENTS

| | | | |
|---|---|---|---|
| 3,566,005 A | | 2/1971 | Shaheen ..................... 174/68.5 |
| 5,311,405 A | * | 5/1994 | Tribbey et al. ............. 174/259 |
| 5,414,222 A | | 5/1995 | Sen et al. ................... 174/262 |
| 5,453,581 A | * | 9/1995 | Liebman et al. ............ 174/261 |
| 5,683,788 A | * | 11/1997 | Dugan et al. ............... 174/261 |
| 5,706,178 A | | 1/1998 | Barrow ....................... 361/777 |
| 5,875,102 A | | 2/1999 | Barrow ....................... 361/777 |
| 6,091,155 A | | 7/2000 | Jonaidi ....................... 257/786 |
| 6,115,262 A | * | 9/2000 | Brunner et al. ............. 174/260 |
| 6,168,854 B1 | | 1/2001 | Gibbs ......................... 428/209 |
| 6,169,253 B1 | | 1/2001 | Jairazbhoy et al. ......... 174/250 |
| 6,192,580 B1 | | 2/2001 | Hayami ....................... 29/846 |
| 6,288,906 B1 | | 9/2001 | Sprietsma et al. .......... 361/772 |
| 6,346,679 B1 | | 2/2002 | Nakamura ................... 174/260 |

\* cited by examiner

*Primary Examiner*—Albert W. Paladini
*Assistant Examiner*—Jeremy Norris
(74) *Attorney, Agent, or Firm*—Schwegman, Lundberg, Woessner & Kluth, P.A.

(57) ABSTRACT

A substrate, such as a printed circuit board (PCB), has pairs of pads to which terminals of electronic components, such as capacitors, can be mounted. The pads have perimeters, for example, in the shape of rectangles, circles, or ovals. In one embodiment, to reduce asymmetrical, lateral, surface-tension forces that can cause the components to tombstone due to uneven heating of solder fillets on the pads during solder reflow, the edge of the perimeter of each pad opposite the inter-pad region contains one or more notches or indentations. Also described are an electronic assembly, an electronic system, and various methods of fabrication.

32 Claims, 7 Drawing Sheets

ANTI-TOMBSTONING STRUCTURES AND METHODS OF MANUFACTURE

RELATED INVENTION

The present invention is related to the following invention which is assigned to the same assignee as the present invention:

Ser. No. 09/887,597, entitled "Via Intersect Pad for Electronic Components and Methods of Manufacture".

TECHNICAL FIELD OF THE INVENTION

The present invention relates to electronic assemblies and, more particularly, to anti-tombstoning structures and associated fabrication methods.

BACKGROUND OF THE INVENTION

"Electronic components", such as integrated circuits (ICs), discrete components, and passive components, can be physically and electrically coupled to a substrate such as a printed circuit board (PCB) to form an "electronic assembly". The "electronic assembly" can be part of an "electronic system". An "electronic system" is broadly defined herein as any product comprising an "electronic assembly".

Examples of electronic systems include computers (e.g., desktops, laptops, hand-helds, servers, Web appliances, routers, etc.), wireless communications devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

In the field of electronic systems there is an incessant competitive pressure among manufacturers to drive the performance and quality of their equipment up while driving down production costs. This is particularly true regarding the packaging of electronic components on substrates, where each new generation of board-level packaging must provide increased performance and quality while generally being smaller or more compact in size.

A substrate typically includes a number of insulation and metal layers selectively patterned to provide metal interconnect lines (referred to herein as "traces"), and a plurality of electronic components mounted on one or more surfaces of the substrate and functionally interconnected through the traces. The routing traces typically carry signals that are transmitted among the electronic components of the system.

One of the conventional ways of mounting components on a substrate is called surface mount technology (SMT). SMT components have terminals or leads (generally referred to as "electrical contacts", "bumps", or "pads") that are soldered directly to the surface of the substrate. SMT components are widely used because of their compact size and simplicity of mounting.

The electrical contacts of an SMT component are coupled to corresponding electrically conductive mounting or bonding pads (also referred to as "lands") on the surface of the substrate, in order to establish secure physical and electrical connections between the component and the substrate. In order to fabricate PCBs in higher densities, it is known to surface-mount certain small passive components, such as capacitors, resistors, and inductors. The resulting electronic system can be manufactured at a lower cost and in a more compact size, and it is therefore more commercially attractive.

Before SMT components are mounted on a substrate, the substrate pads are selectively coated with solder paste. Next, the component is carefully positioned or "registered" over the substrate, so that its electrical terminals are aligned with the corresponding substrate pads. Finally, in an operation known as "solder reflow", the component terminals and the PCB pads are heated to a temperature that melts the solder paste, so that the terminals and pads make proper electrical and physical connections.

As will be discussed in greater detail below, mounting electronic components on currently used substrate pad structures can result in significant manufacturing defects.

For the reasons stated above, and for other reasons stated below which will become apparent to those skilled in the art upon reading and understanding the present specification, there is a significant need in the art for apparatus and methods for mounting components to a substrate that offer relatively high density and high quality interconnections at a reasonable production cost.

DETAILED DESCRIPTION OF EMBODIMENTS OF THE INVENTION

In the following detailed description of embodiments of the invention, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that compositional, procedural, mechanical, and electrical changes may be made without departing from the spirit and scope of the present inventions. The following detailed description is, therefore, not to be taken in a limiting sense, and the scope of the present invention is defined only by the appended claims.

The present invention provides a solution to the problem of solder reflow defects occurring when electronic components are surface-mounted on substrates. In the present invention, pads are formed in irregular shapes, e.g. comprising indentations or notches in their perimeters. Various embodiments are illustrated and described herein.

For example, one embodiment comprises a substrate whose pad structures reduce asymmetrical, lateral, surface-tension forces that can cause components to "tombstone" (i.e. stand up on end) due to uneven heating of solder fillets on the pads during solder reflow. The perimeter of each pad opposite an "inter-pad region" (i.e. the region between an associated set of pads to which one component is to be mounted) contains one or more indentations or notches. Also described are an electronic assembly, an electronic system, and various methods of fabrication.

In addition to the foregoing advantages, the apparatus and methods of the present invention are compatible with existing packaging technologies, so that significant quality improvements are achieved at a relatively low implementation cost, thus making the apparatus and methods of the present invention commercially competitive.

Figure 1:
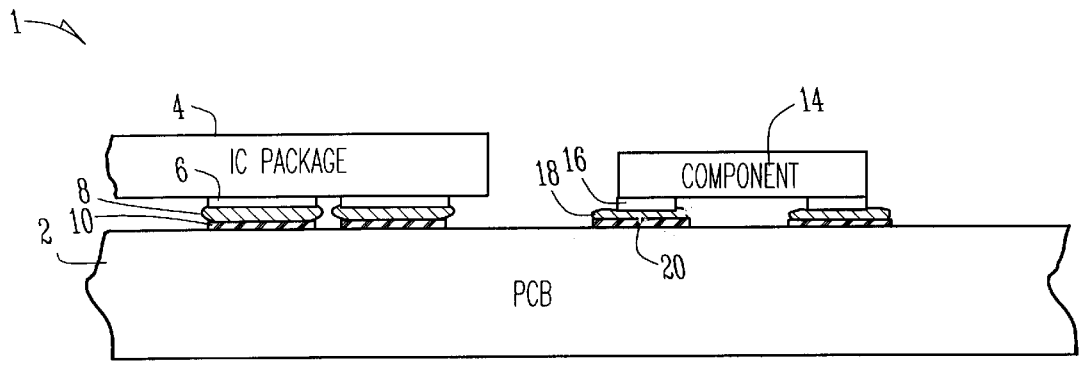
FIG. 1 is a side view of a portion of a prior art electronic assembly, including a PCB, an IC package, and a two-terminal component.

FIG. 1 is a side view of a portion of a prior art electronic assembly 1, including a PCB 2, an IC package 4, and a two-terminal component 14. PCB 2 comprises a plurality of pads, such as pads 10, to which IC packages, such as IC package 4, can be mounted.

PCB 2 further comprises a plurality of pads, such as pads 20, to which components, such as component 14, can be mounted.

IC package 4 comprises a plurality of bumps or terminals, such as terminals 6, on a surface of IC package 4. The electrical component in IC package 4 that is mounted to PCB 2 can be of any type, such as a microprocessor or microcontroller, memory circuit, application specific integrated circuit (ASIC), digital signal processor (DSP), a radio frequency circuit, an amplifier, a power converter, a filter, a clocking circuit, and the like.

Component 14 comprises a plurality of bumps or terminals, such as terminals 16, on a surface of component 14. Although terminals 16 are shown in FIG. 1 as being disposed on only one surface (e.g. the lower surface) of component 14, it will be understood by those of ordinary skill in the art that terminals 16 may extend partially or completely up the side of component 14. Alternatively, terminals 16 may extend completely up the side of component 14 and then extend partially along the upper surface of component 14, provided that terminals of different polarity and/or function do not contact each other. The foregoing alternative ways in which terminals can be disposed on components apply to any terminal depicted within this description, whether such terminal forms part of a prior art electronic assembly or part of an electronic assembly fabricated in accordance with the present invention. The present invention is not intended to be limited to any particular arrangement, type, or geometry of terminal or component.

IC package 4 and component 14, which are representative of potentially large numbers of IC packages and components, are physically and electrically mounted to PCB 2. In a well-known process, solder paste is applied to the IC package terminals 6 and the component terminals 16, or alternatively to the PCB pads 10 and 20. Next, the bumps 6 of IC package 4 are aligned with PCB pads 10, and the bumps 16 of component 14 are aligned with PCB pads 20. Next, the entire electronic assembly 1 is heated to reflow temperature, melting the solder, and the electronic assembly 1 is allowed to cool. As a result, a thin layer of solder 8 couples each IC package terminal 6 to its associated PCB pad 10, and a thin layer of solder 18 couples each component terminal 16 to its associated PCB pad 20.

Figure 2:
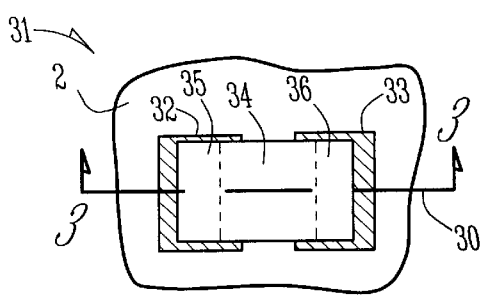
FIG. 2 is a top view of a portion of a prior art electronic assembly, including a pair of rectangular pads and a two-terminal component.

FIG. 2 is a top view of a portion of a prior art electronic assembly 31, including a pair of rectangular pads 32 and 33 and a two-terminal component 34. The portion of a prior art electronic assembly 31 can be, for example, from the electronic assembly 1 shown in FIG. 1 that includes PCB 2. Component 34 comprises a pair of terminals 35 and 36 on the underside of component 34. (These are better seen in FIG. 3.) Terminals 35 and 36 are mounted to respective pads 32 and 33 lying on the upper surface of PCB 2.

Figure 3:
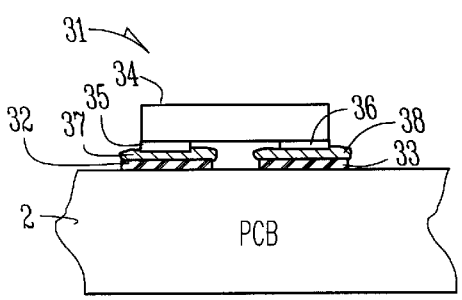
FIG. 3 is a sectional view, taken along dashed line 30 of FIG. 2, of the portion of the prior art electronic assembly shown in FIG. 2.

FIG. 3 is a sectional view, taken along dashed line 30 of FIG. 2, of the portion of the prior art electronic assembly 31 shown in FIG. 2. Component 34 comprises a pair of terminals 35 and 36 on its lower surface. Terminals 35 and 36 are coupled via solder layers 37 and 38, respectively, to pads 32 and 33, respectively, on the upper surface of PCB 2.

Figure 4:
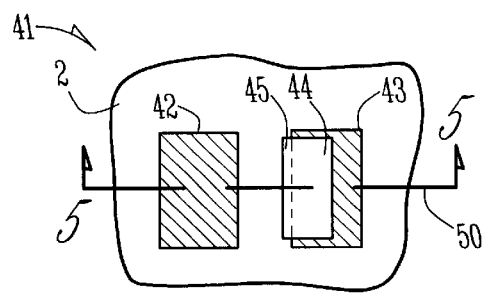
FIG. 4 is a top view of a portion of a prior art electronic assembly, including a pair of rectangular pads and a tombstoned component.

FIG. 4 is a top view of a portion of a prior art electronic assembly 41, including a pair of rectangular pads 42 and 43, and a tombstoned component 44. The portion of a prior art electronic assembly 41 can be similar to that shown in FIG. 2, except that component 44 is in a raised "tombstone" position that is better viewed in FIG. 5, which is described immediately below.

Figure 5:
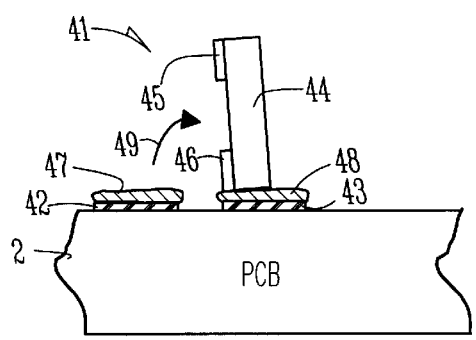
FIG. 5 is a sectional view, taken along dashed line 50 of FIG. 4, of the portion of the prior art electronic assembly shown in FIG. 4.

FIG. 5 is a sectional view, taken along dashed line 50 of FIG. 4, of the portion of the prior art electronic assembly 41 shown in FIG. 4. Component 44 comprises a pair of terminals 45 and 46 on its lower surface. Terminals 45 and 46 are intended to be coupled via solder layers 47 and 48, respectively, to pads 42 and 43, respectively, on the upper surface of PCB 2. However, due to unequal heating of the electronic assembly 41 during the solder reflow stage, solder layer 48 melted before solder layer 47 melted.

As a consequence (and possibly made even more susceptible as a result of small vibrations experienced by the electronic assembly during the reflow operation), surface tension forces caused component 44 to flip or rotate upward in the direction indicated by arrow 49, so that following solder reflow and the cool-down stage component 44 remains upright, and terminal 45 is completely out of contact with solder layer 47. This open solder joint represents a significant quality defect. This "tombstone" defect can sometimes be corrected manually but at a significant increase in manufacturing cost.

Figure 6:
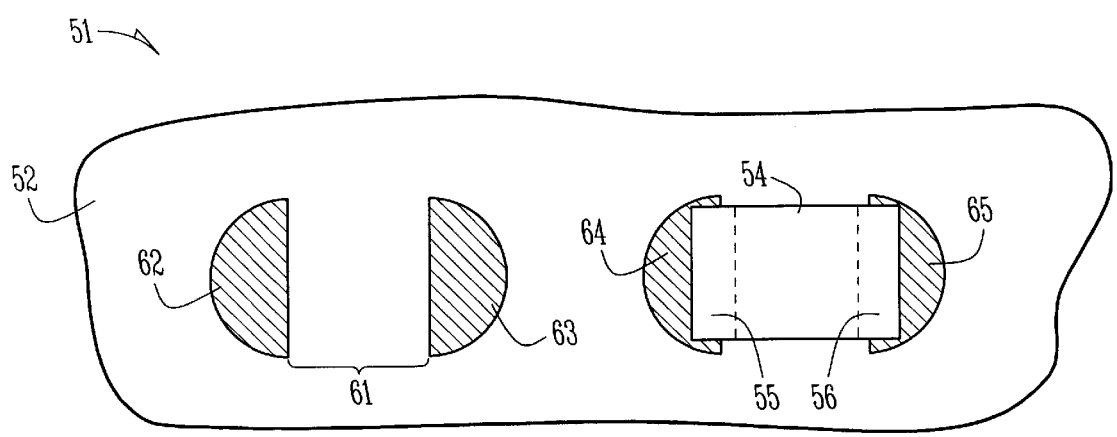
FIG. 6 is a top view of a portion of a prior art electronics assembly, including first pair of semi-circular pads in a component-mounting region, and a second pair of semi-circular pads upon which a two-terminal component has been mounted.

FIG. 6 is a top view of a portion of a prior art electronics assembly 51, including a first pair of semi-circular pads 62 and 63 in a component-mounting region, and a second pair of semi-circular pads 64 and 65 upon which a two-terminal component 54 has been mounted. In prior art electronic assembly 51, each pair of semi-circular pads (i.e. pads 62 and 63) is arranged on the surface of PCB 52 with the straight sides of the pads opposing one another on either side of inter-pad region 61, and with the curved portions of the pads facing away from the inter-pad region 61. Component 54 comprises first terminal 55 and second terminal 56, which are for mounting onto pads 64 and 65, respectively.

Figure 7:
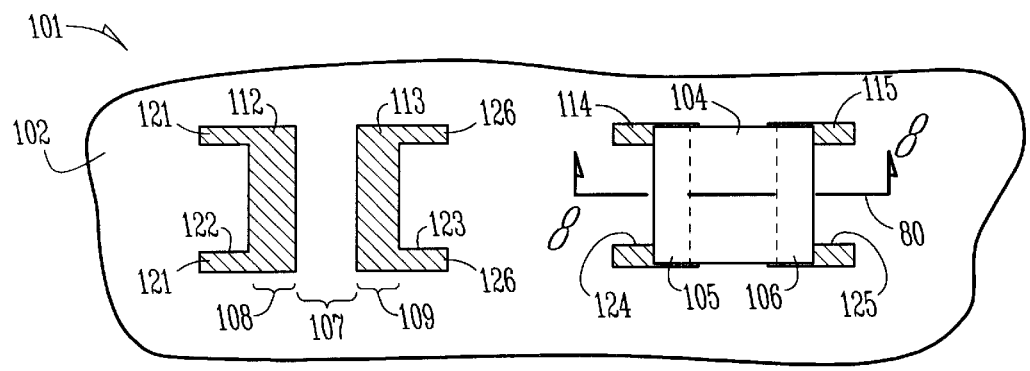
FIG. 7 illustrates a top view of a portion of an electronic assembly-comprising pads having an indentation, in accordance with one embodiment of the invention.

FIG. 7 illustrates a top view of a portion of an electronic assembly 101 comprising a first opposing pair of pads 112 and 113 in a component-mounting region of PCB 102, and a second opposing pair of pads 114 and 115 upon which a two-terminal component 104 has been mounted, in accordance with one embodiment of the invention. PCB 102 and component 104 form an electronic assembly 101 that can be part of an electronic system. Electronic assembly 101 can comprise ICs (not shown).

The component 104 that is mounted to PCB 102 can be any type of component. In one embodiment, it is a passive surface-mount technology (SMT) element such as an capacitor, inductor, or resistor; however, it could be any other kind of electrical or electronic device, such as a coil, fuse, small-outline transistor, plastic-leaded chip carrier, ceramic chip carrier, small-outline IC, small-outline J-lead package, dual in-line package, gull-wing package, or the like.

On the portion of PCB 102 illustrated in FIG. 7, each of pads 112–115 has an irregular region. An "irregular region" is defined herein to mean a region that contains one or more indentations, notches, grooves, fingers, digits, cut-outs, cut-aways, crenellations, zig-zags, or the like. For example, by way of illustration but not of limitation, pad 112 comprises an irregular region in the form of an indentation 122 between projections 121. Likewise, pad 113 comprises an indentation 123 between projections 126. Similarly, pads 114 and 115 comprise indentations 124 and 125, respectively.

In the embodiment shown in FIG. 7, the irregular region of each pad is disposed further from the inter-pad region (as defined above) than the "bonding region". A "bonding region" is defined herein to mean the projection of a terminal of a component upon a bonding pad. That is, a bonding region includes that portion of the bonding pad to which the component terminal is affixed with an adhesive such as solder, but a bonding region can also include a portion of one or more indentations of the irregular region of a pad, depending upon how the component terminal projects upon the pad. Bonding regions 108 and 109 are shown for the embodiment illustrated in FIG. 7. Bonding regions 108 and 109 are to receive, and have mounted thereon, corresponding terminals of a component, such as terminals 105 and 106 of component 104. It will be understood that in other embodiments the bonding regions 108 and 109 may overlap with indentations 122 and 123, respectively, depending upon how component terminals, such as terminals 105 and 106, may project upon pads 112 and 113, respectively.

In the embodiment shown in FIG. 7, each pair of pads (i.e. pads 112 and 113) is arranged on the surface of PCB 102 with the straight sides of the pads opposing one another on either side of inter-pad region 107, and with the indented sides of the pads (i.e. the irregular regions) disposed in a direction away from the inter-pad region 107 and separated from the inter-pad region 107 by the bonding regions 108 and 109.

Component 104 comprises first terminal 105 and second terminal 106, which are for mounting onto pads 114 and 115, respectively. In this embodiment, the "out-board" edge (i.e. the edge furthest away from the inter-pad region) of terminal 105 is substantially lined up with the inner edge of indentation 122 of C-shaped pad 114. This can also be seen in FIG. 8. Similarly, the out-board edge of terminal 106 is substantially lined up with the inner edge of indentation 122 of C-shaped pad 115.

In other words, the indentation 124 of pad 114 does not overlap the bonding region of pad 114 (which is assumed to have identical geometry to the bonding region 108 of pad 112). Likewise, the indentation 125 of pad 115 does not overlap the bonding region of pad 115 (which is assumed to have identical geometry to the bonding region 109 of pad 113).

However, in other embodiments these edges do not necessarily line up, and the out-board edges of the component terminals could overlap the one or more indentations of the irregular regions. Alternatively, they could be situated further towards the inter-pad region than is illustrated in FIG. 7

Further, in this embodiment, the upper and lower edges (as viewed in FIG. 7) of component 104 are substantially lined up with the upper and lower edges of pads 114 and 115. However, in other embodiments these edges do not necessarily line up.

Figure 8:
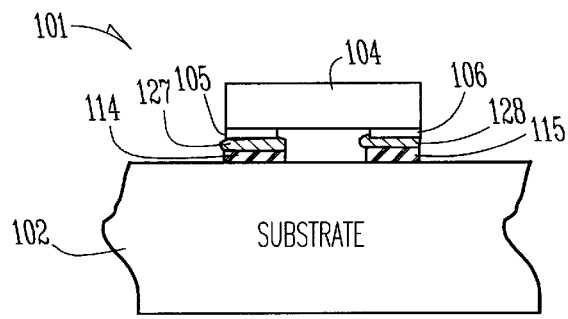
FIG. 8 illustrates a sectional view, taken along dashed line 80 of FIG. 7, of the electronic assembly shown in FIG. 7.

FIG. 8 illustrates a sectional view, taken along dashed line 80 of FIG. 7, of the electronic assembly 101 shown in FIG. 7. Component 104 comprises a pair of terminals 105 and 106 on its lower surface. Terminals 105 and 106 are coupled via solder layers 127 and 128, respectively, to pads 114 and 115, respectively, on the upper surface of PCB 102.

Figure 9:
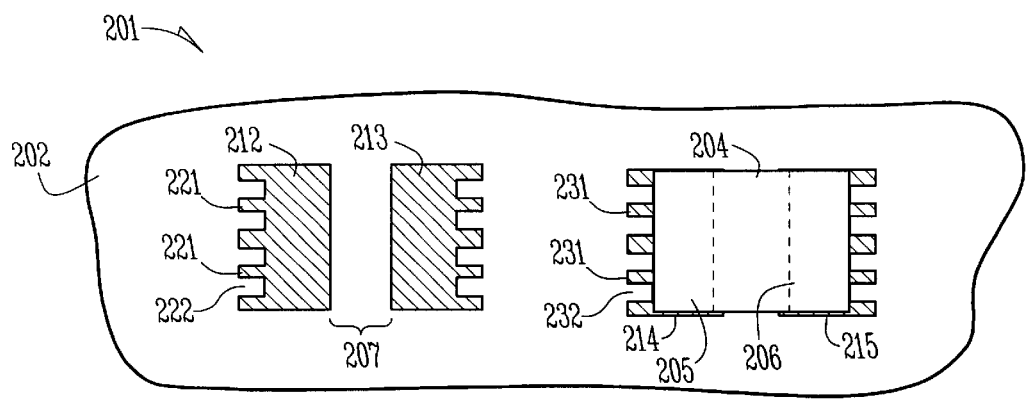
FIG. 9 illustrates a top view of a portion of an electronic assembly comprising pads having a plurality of indentations, in accordance with one embodiment of the invention.

FIG. 9 illustrates a top view of a portion of an electronic assembly 201 comprising a first pair of pads 212 and 213 in a component-mounting region on PCB 202, and a second pair of pads 214 and 215 upon which a two-terminal component 204 has been mounted, in accordance with one embodiment of the invention.

Each of pads 212–215 comprises a plurality of indentations. For example, by way of illustration but not of limitation, pad 212 comprises a plurality of indentations 222 between projections or digits 221, and pad 214 comprises a plurality of indentations 232 between projections 231. Similarly, pads 213 and 215 each comprise a plurality of indentations.

Each pair of pads (i.e. pads 212 and 213) is arranged on the surface of PCB 202 with the straight sides of the pads opposing one another on either side of inter-pad region 207, and with the indented sides of the pads facing away from the inter-pad region 207.

Component 204 comprises first terminal 205 and second terminal 206, which are for mounting onto pads 214 and 215, respectively.

Figure 10:
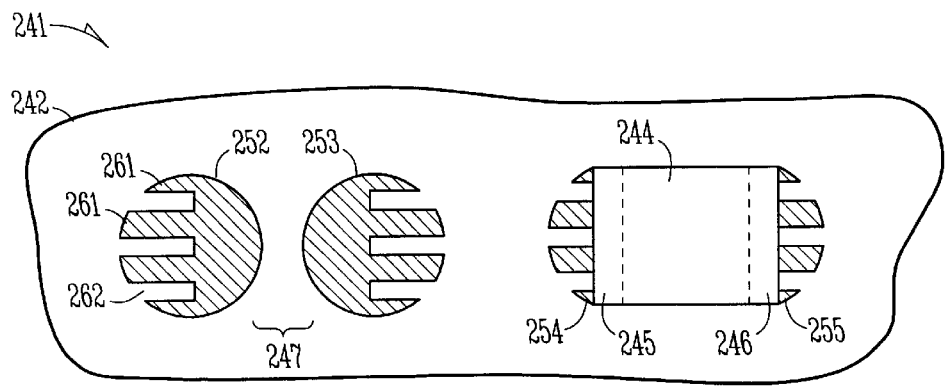
FIG. 10 illustrates a top view of a portion of an electronic assembly comprising elliptical pads having a plurality of indentations, in accordance with one embodiment of the invention.

FIG. 10 illustrates a top view of a portion of an electronic assembly 241 comprising a first pair of elliptical pads 252 and 253 in a component-mounting region of a PCB 242, and a second pair of elliptical pads 254 and 255 upon which a two-terminal component 244 has been mounted, in accordance with one embodiment of the invention. Although pads 252 and 253 are illustrated as having a substantially circular perimeter (except for the indentations), pads 252 and 253 could also be oval. The term "elliptical", as used herein, means substantially circular or oval. Pads 252 and 253 could also have other geometric perimeters, including free-form perimeters.

Each of pads 252–255 has a plurality of indentations. For example, by way of illustration but not of limitation, pad 252 comprises a plurality of indentations 262 between projections 261. Similarly, pads 253, 254, and 255 each comprise a plurality of indentations.

Each pair of pads (i.e. pads 252 and 253) is arranged on the surface of PCB 242 with the non-indented sides of the pads opposing one another on either side of inter-pad region 247, and with the indented sides of the pads facing away from the inter-pad region 247.

Component 244 comprises first terminal 245 and second terminal 246, which are for mounting onto pads 254 and 255, respectively.

Figure 11:
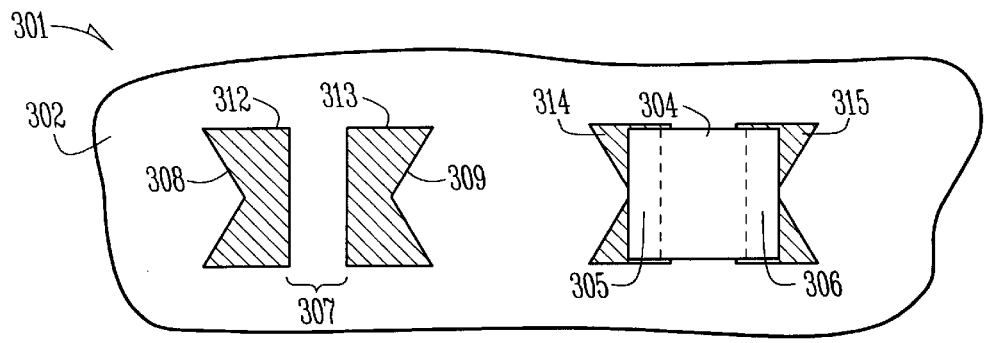
FIG. 11 illustrates a top view of a portion of an electronic assembly comprising pads having a substantially straight-sided indentation, in accordance with one embodiment of the invention.

FIG. 11 illustrates a top view of a portion of an electronic assembly 301 comprising a first pair of pads 312 and 313 in a component-mounting region of PCB 302, and a second pair of pads 314 and 315 upon which a two-terminal component 304 has been mounted, in accordance with one embodiment of the invention.

As shown in FIG. 11, each of pads 312-315 comprises a substantially straight-sided groove or notch. For example, by way of illustration but not of limitation, pad 312 comprises a groove 308, and pad 313 comprises a groove 309. Similarly, pads 314 and 315 each comprise a groove. The sides of the grooves can have geometries other than straight, including curved, scalloped, zig-zag, concave, convex, jagged, and free-form.

Each pair of pads (i.e. pads 312 and 313) is arranged on the surface of PCB 302 with the non-grooved sides of the pads opposing one another on either side of inter-pad region 307, and with the grooved sides of the pads facing away from the inter-pad region 307.

Component 304 comprises first terminal 305 and second terminal 306, which are for mounting onto pads 314 and 315, respectively.

Figure 12:
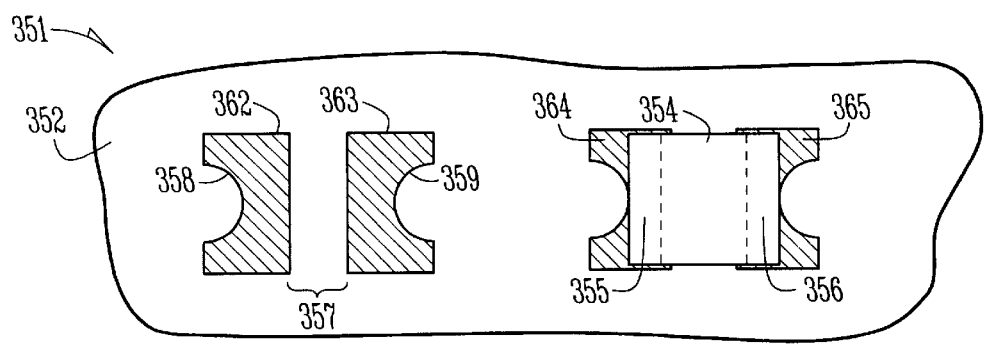
FIG. 12 illustrates a top view of a portion of an electronic assembly comprising pads having a substantially semi-circular indentation, in accordance with one embodiment of the invention.

FIG. 12 illustrates a top view of a portion of an electronic assembly 351 comprising a first pair of pads 362 and 363 in a component-mounting region of PCB 352, and a second pair of pads 364 and 365 upon which a two-terminal component 354 has been mounted, in accordance with one embodiment of the invention.

Each of pads 362-365 comprises a substantially semi-circular indentation. For example, by way of illustration but not of limitation, pad 362 comprises a semi-circular indentation 358, and pad 363 comprises a semi-circular indentation 359. Similarly, pads 364 and 365 each comprise a semi-circular indentation. The edges of the indentations can have geometries other than semi-circular, including parabolic, oval, scalloped, zig-zag, jagged, and free-form.

Each pair of pads (i.e. pads 362 and 363) is arranged on the surface of PCB 352 with the non-indented sides of the pads opposing one another on either side of inter-pad region 357, and with the indented sides of the pads facing away from the inter-pad region 357.

Component 354 comprises first terminal 355 and second terminal 356, which are for mounting onto pads 364 and 365, respectively.

Figure 13:
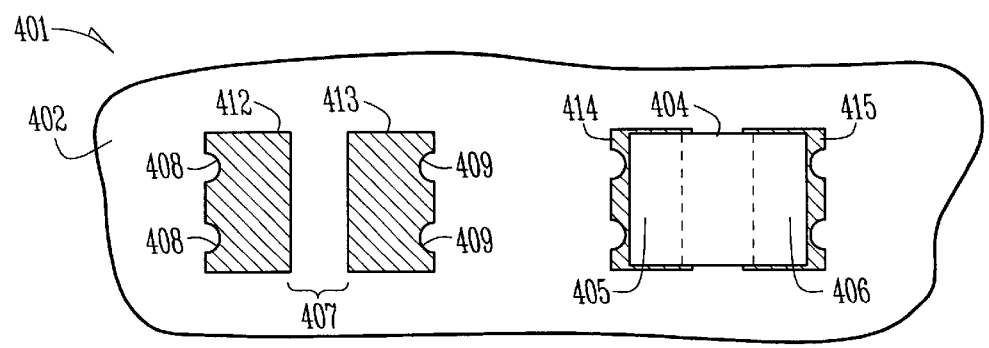
FIG. 13 illustrates a top view of a portion of an electronic assembly comprising pads having a plurality of substantially semi-circular indentations, in accordance with one embodiment of the invention.

FIG. 13 illustrates a top view of a portion of an electronic assembly 401 comprising a first pair of pads 412 and 413 in a component-mounting region of PCB 402, and a second pair of pads 414 and 415 upon which a two-terminal component 404 has been mounted, in accordance with one embodiment of the invention.

Each of pads 412–415 comprises a plurality of substantially semi-circular indentations. For example, by way of illustration but not of limitation, pad 412 comprises two semi-circular indentations 408, and pad 413 comprises two semicircular indentations 409. Similarly, pads 414 and 415 each comprise a pair of semicircular indentations. The edges of the indentations can have geometries other than semi-circular, including parabolic, oval, scalloped, zig-zag, jagged, and free-form.

Each pair of pads (i.e. pads 412 and 413) is arranged on the surface of PCB 402 with the non-indented sides of the pads opposing one another on either side of inter-pad region 407, and with the indented sides of the pads facing away from the inter-pad region 407.

Component 404 comprises first terminal 405 and second terminal 406, which are for mounting onto pads 414 and 415, respectively.

Figure 14:
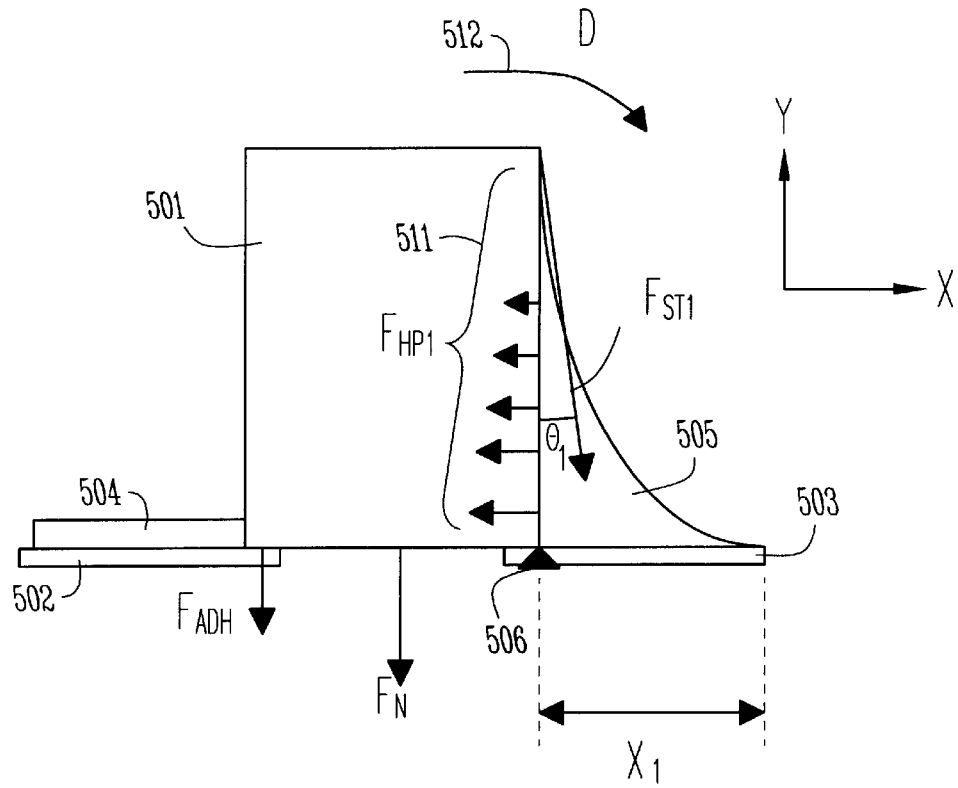
FIG. 14 is a diagram illustrating various forces acting upon a component being mounted under potential tombstoning conditions to a pair of pads, the outer edges of whose perimeters are a first distance from the respective edges of the component.

FIG. 14 is a diagram illustrating various forces acting upon a component 501 being mounted under potential tombstoning conditions to a pair of pads 502 and 503, the outer edges of whose perimeters are a first distance $X_1$ from the respective edges of the component 501. The height of the rectangle representing component 501 is exaggerated in FIG. 14. The two thin rectangles representing pads 502 and 503 are assumed to lie on the upper surface of a PCB (not shown). It is assumed that the electronic assembly, of which component 501 as well as pads 502 and 503 form a part, is undergoing solder reflow; that a layer of solder paste 504 on pad 502 is unmelted; and that solder paste on pad 503 has melted to form a solder fillet 505 that characteristically has flowed high up onto the side of component 501. This is a situation that often causes tombstoning, for reasons that will now be discussed.

While experiencing tombstoning forces, component 501 will have a tendency to rotate clockwise about fulcrum 506 in a direction indicated by arrow 512. The forces that create moments about this fulcrum include the following:

$F_{ADH}$—an adhesive force between the solder paste 504 on the not yet reflowed pad 502 and component 501. Force $F_{ADH}$ exerts a counter-clockwise moment on component 501.

$F_N$—the normal force of component 501 due to gravity, exerting a counter-clockwise moment on component 501.

$F_{HP1}$—the hydrostatic pressure of the molten solder in solder fillet 505 against the side of component 501, exerting a counter-clockwise moment on component 501. FHP1 represents the sum of the hydrostatic force vectors enclosed by bracket 511.

$F_{ST1}$—the surface tension of the solder fillet 505 pulling on the right-hand side of component 501 in a direction essentially tangential to the outer surface of the solder. (Refer also to FIG. 16.) The solder fillet 505 makes a contact angle with the top of component 501 at an angle $\theta_1$. The surface tension force $F_{ST1}$ can be resolved into two vectors, as is explained in greater detail below regarding FIG. 16. One vector ($F_{ST1}$* COS $\theta_1$) of this force has no moment arm, because it is directed downwardly, in the negative Y direction, to fulcrum 506, and it thus has no effect on the rotation of component 501. The second vector ($F_{ST1}$* SIN $\theta_1$) of this force acts in the X direction. This vector acts to rotate component 501 in a clockwise direction about fulcrum 506.

In the schematic illustrated in FIG. 14, the distance between fulcrum 506 and the right-hand edge of pad 503 is $X_1$. As will be seen from the description of FIG. 15, by effectively shortening this distance, the size of angle $\theta$ is decreased, the magnitude of the vector acting in the X direction is decreased, and the propensity of component 501 to tombstone is substantially reduced.

Figure 15:
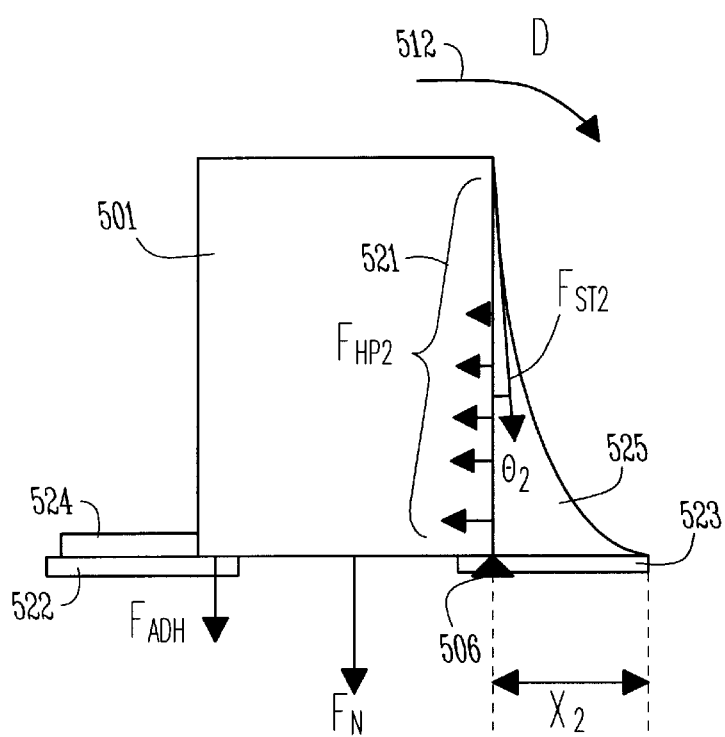
FIG. 15 is a diagram illustrating various forces acting upon a component being mounted under potential tombstoning conditions to a pair of pads, the outer edges of whose perimeters are a second distance from the respective edges of the component.

FIG. 15 is a diagram illustrating various forces acting upon a component 501 being mounted under potential tombstoning conditions to a pair of pads 522 and 523, the outer edges of whose perimeters are a second distance $X_2$ from the respective edges of the component 501. Essentially the same conditions are assumed for the diagram of FIG. 15 as for the diagram described in FIG. 14, including the assumption that a layer of solder paste 524 on pad 522 is unmelted, and that solder paste on pad 523 has melted to form solder fillet 525.

In FIG. 15, forces $F_{ADH}$ and $F_N$ remain substantially the same as in FIG. 14. However, the hydrostatic force $F_{ST2}$, represented by the sum of the hydrostatic force vectors enclosed by bracket 521, will be slightly smaller than the hydrostatic force $F_{ST1}$ in FIG. 14, because distance $X_2$ is less than distance $X_1$ in FIG. 14.

Further, the size of angle $\theta_2$ of surface tension force $F_{ST2}$ is decreased, and the magnitude of the vector acting in the X direction is decreased. Because the sum of the moments acting upon component 501, for the conditions shown in FIG. 15, produces a substantially decreased resulting clockwise torque (i.e., in the direction indicated by arrow 512), component 501 is less likely to tombstone.

By decreasing the distance $X_2$ that solder pad 506 extends beyond the edge of component 501, the contact angle $\theta_2$ is decreased. As the contact angle $\theta_2$ is decreased, the force that creates clockwise rotation, i.e. $F_{ST2}$* SIN $\theta_2$, is decreased. This results in a lower frequency of tombstoning.

Figure 16:
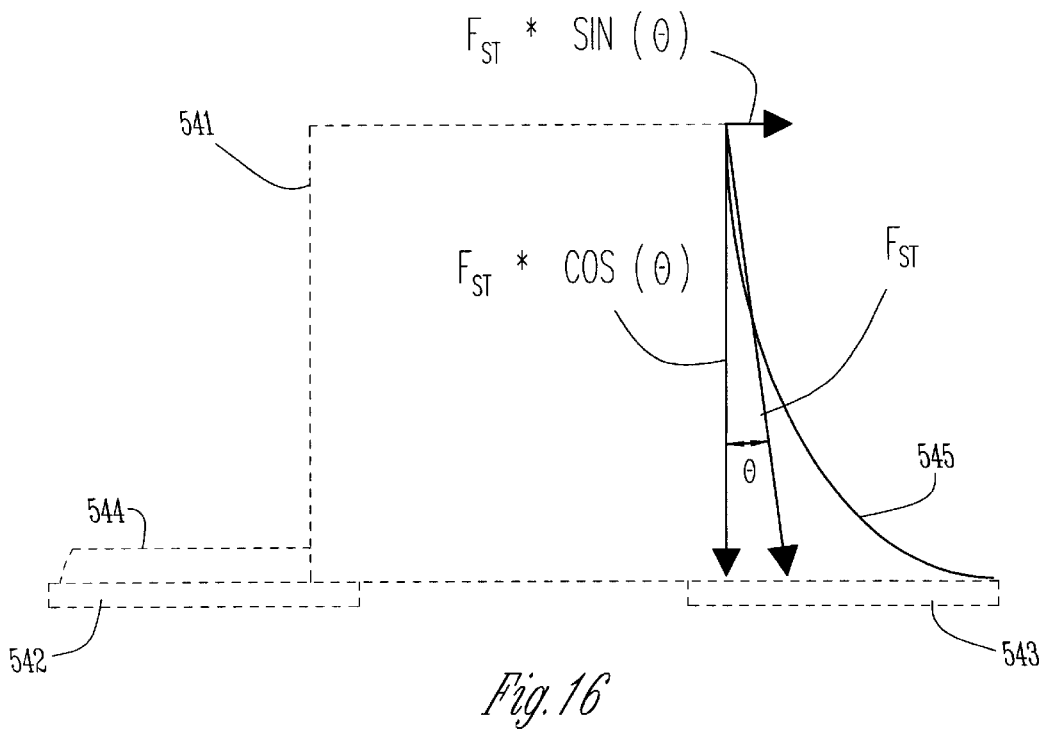
FIG 16 is a diagram illustrating a surface tension force, and horizontal and vertical components thereof, acting upon an electrical component being mounted under potential tombstoning conditions to a pair of pads.

FIG. 16 is a diagram illustrating a surface tension force $F_{ST}$, and horizontal and vertical components thereof, acting upon an electrical component 541 being mounted under potential tombstoning conditions to a pair of pads 542 and 543. It is assumed that a layer of solder paste 544 on pad 542 is unmelted, and that solder paste on pad 533 has melted to form solder fillet 545. The structure of component 541, pads 542 and 543, and solder paste layer 544 are shown in dashed outline in FIG. 16 for ease of understanding, because the primary emphasis in FIG. 16 is on force $F_{ST}$ and its X and Y components.

Surface tension force $F_{ST}$ pulls in a manner that is essentially tangential to the exposed outer surface of melted solder fillet 545. $F_{ST}$ forms an angle $\theta$ outwardly from the right-hand edge of component 541. $F_{ST}$ can be resolved into an X component, represented by $F_{ST}$* SIN $\theta$, and a Y component, represented by $F_{ST}$* COS $\theta$.

Figure 17:
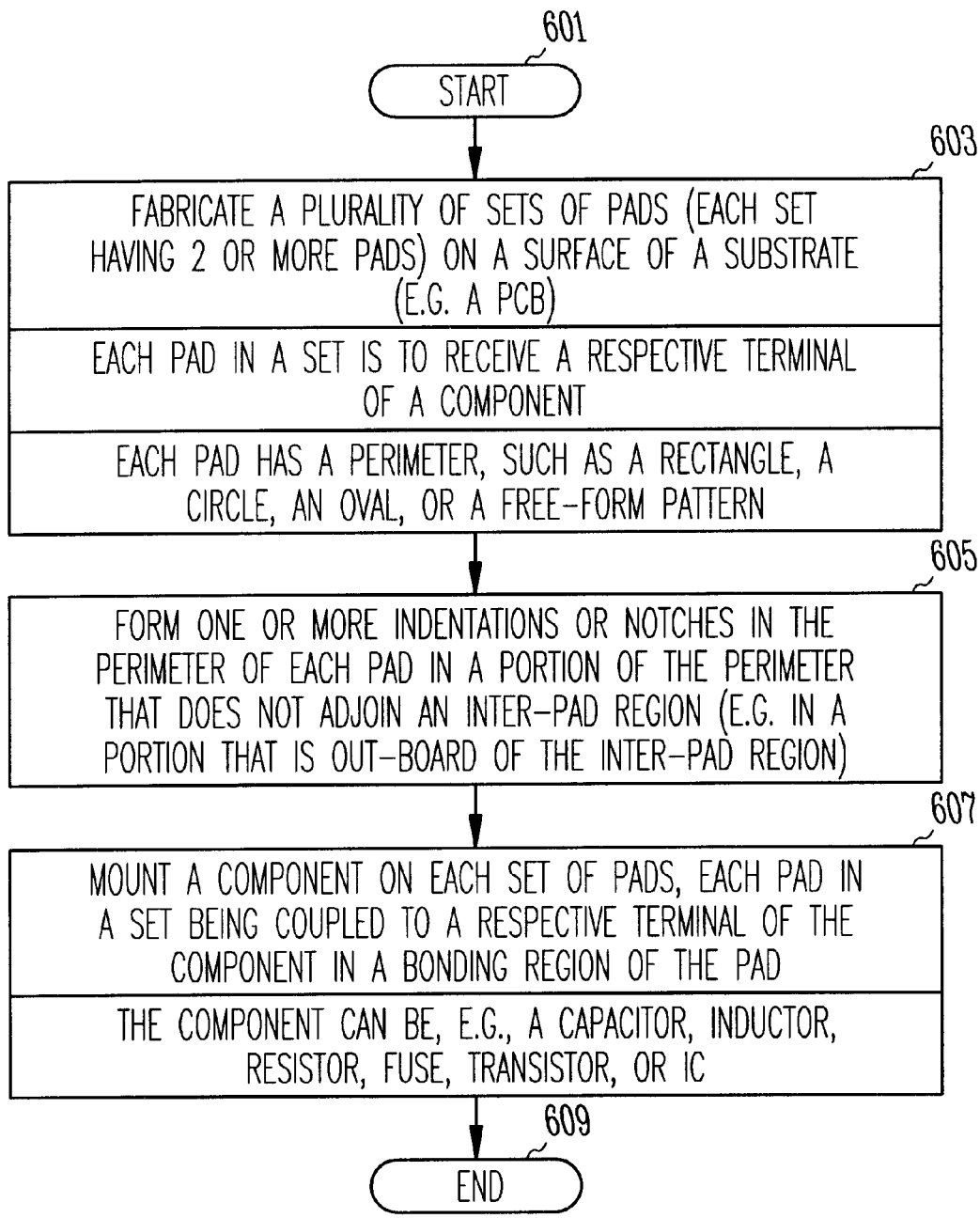
FIG. 17 illustrates a method of fabricating pads on a substrate surface, and a method of fabricating an electronic assembly, in accordance with embodiments of the invention.

FIG. 17 illustrates a method of fabricating pads on a substrate surface, and a method of fabricating an electronic assembly, in accordance with embodiments of the invention.

601 through 605 define a method of fabricating pads on a substrate surface. The methods begin at 601.

In 603, a plurality of sets of pads is fabricated on a surface of a substrate, such as a PCB. Each set can have two or more pads. The intended purpose of each pad in a set is to receive a respective terminal of a component. Generally, there is one set of pads per component to be mounted upon the substrate. The number of pads per set depends upon the number of terminals per component. For passive components, such as capacitors, having two terminals, each set comprises a pair of pads. Each pad has a perimeter, which can be of any suitable shape including, but not limited to, a rectangle, a circle, an oval, a free-form pattern, and any combination of the foregoing.

In 605, one or more indentations, notches, cut-outs, cut-aways, grooves, or the like, is formed in the perimeter of each pad in a portion of the perimeter that does not adjoin an inter-pad region. For example, the portion of the perimeter is out-board of the inter-pad region.

601 through 607 define a method of fabricating an electronic assembly, wherein 601 through 605 can be essentially the same as described above.

In 607, a component is mounted on each set of pads. Each pad in a set is coupled to a respective terminal of the component in a bonding region of the pad. The terminals can be coupled to their respective pads through any suitable mechanism, including solder, using the well known solder reflow process described herein.

The component can be any type of electrical component such as those mentioned earlier. In one embodiment, the component is a so-called "0508" capacitor, i.e. a capacitor 50 mils (1.27 mm) wide and 80 mils (2.032 mm) long. The teachings of the present invention can also be used to advantage with smaller SMT passive components, such as 0201's (20 mils×10 mils) and 0402's (40 mils×20 mils). It can also be used with larger SMT passive components, such as 0603's (60 mils×30 mils) and 1210's (120 mils×100 mils). These component sizes are merely representative and are not intended to be limiting.

It will be understood that a PCB can include different types of components, and that a PCB can include multiple components of each type, depending upon its intended function.

The methods end at 609.

The operations described above with respect to FIG. 17 could be performed in a different order from those described herein.

CONCLUSION

The present invention provides significantly improved reliability of the solder connections between the electrical contacts of electronic components, such as SMT passive components, and corresponding pads on substrates, e.g., printed circuit boards.

Pad structures have been disclosed that reduce asymmetrical, lateral, surface-tension forces that can cause components to "tombstone". In one embodiment, the perimeter of each pad opposite an "inter-pad region" contains one or more indentations or notches.

By forming pads so as to reduce the contact angle $\theta$ between the component and the melted solder fillet, the surface tension component that is acting to rotate the component is substantially reduced. This solves several significant manufacturing defect problems, while allowing PCB real estate and PCB fabrication costs to be kept to a minimum. This has the overall effect of providing solder connections between the component and the PCB substrate that are less prone to defects, thus ensuring greater reliability of the electronic assembly and of any electronic system incorporating such electronic assembly.

As shown herein, the present invention can be implemented in a number of different embodiments, including a method for fabricating a substrate, a method for fabricating an electronic assembly, a substrate, an electronic assembly, and an electronic system. Other embodiments will be readily apparent to those of ordinary skill in the art. The elements, compositions, geometry, architecture, dimensions, and sequence of operations can all be varied to suit particular product and packaging requirements.

While components having only two terminals have been shown and described, the invention is not limited to components having only two terminals. Many types of components, including passive components, can comprise more than two terminals, and the precepts of the invention can readily be extended to component-mounting regions that will accommodate such components. For example, the invention can be used to mount quad flat-packs, dual in-line packages, gull-wing packages, 0402 arrays (i.e. two or more 0402 components coupled together), and so forth.

The various elements depicted in the drawings are merely representational and are not drawn to scale. Certain proportions thereof may be exaggerated, while others may be minimized. The drawings are intended to illustrate various implementations of the invention, which can be understood and appropriately carried out by those of ordinary skill in the art.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A substrate comprising a plurality of opposing sets of pads, each set of pads having an inter-pad region, each pad in a set to receive a respective terminal of an electronic component in a bonding region thereof, and each pad of each set having a circular perimeter with a plurality of parallel indentations therein facing away from the inter-pad region and having an inner edge, wherein the bonding region extends in a direction away from the inter-pad region to at least the inner edge of the plurality of indentations of the corresponding pad.

2. The substrate of claim 1, wherein for each pad the bonding region partially overlaps the inner edge of the plurality of indentations.

3. The substrate of claim 1, wherein each set comprises two pads.

4. An electronic assembly comprising:
   a substrate having a plurality of pairs of pads, each pair of pads having an inter-pad region, each pad having a bonding region and a perimeter with at least one notch therein facing away from the bonding region and having an inner edge; and
   a component mounted on each pair of pads, the bonding region of each pad in a pair being coupled to a respective terminal of the component, wherein each terminal has an out-board edge that is lined up with the inner edge of the notch of the corresponding pad.

5. The electronic assembly recited in claim 4, wherein each pad comprises a plurality of notches therein facing away from the bonding area and each having an inner edge, and wherein the out-board edge of each terminal is lined up with the inner edges of the plurality of notches of the corresponding pad.

6. The electronic assembly recited in claim 4, wherein the perimeter has a geometric pattern from the group comprising a rectangle, a circle, an oval, a free-form pattern, or a combination of the foregoing.

7. The electronic assembly recited in claim 4, wherein the component is from the group comprising a capacitor, inductor, resistor, fuse, transistor, and integrated circuit.

8. The electronic assembly recited in claim 4, wherein each pad has an upper edge and a lower edge, and wherein each terminal of each component has an upper edge and a lower edge that are lined up with the upper edge and lower edge of the corresponding pad, respectively.

9. An electronic assembly comprising:
   a substrate having a plurality of sets of pads, each set of pads having an inter-pad region, each pad having a bonding region and a perimeter with at least one indentation therein facing away from the bonding region and having an inner edge; and
   a component mounted on each set of pads, the bonding region of each pad in a set being coupled to a respective terminal of the component, wherein each terminal has an out-board edge that extends in a direction away from the inter-pad region to at least the inner edge of the indentation of the corresponding pad.

10. The electronic assembly recited in claim 9, wherein each set comprises two pads.

11. The electronic assembly recited in claim 9, wherein each pad comprises a plurality of indentations therein facing away from the bonding area and each having an inner edge, and wherein the out-board edge of each terminal extends in a direction away from the inter-pad region to at least the inner edges of the plurality of indentations of the corresponding pad.

12. The electronic assembly recited in claim 9, wherein for each pad the bonding region partially overlaps the at least one indentation.

13. The electronic assembly recited in claim 9, wherein the component is from the group comprising a capacitor, inductor, resistor, fuse, transistor, and integrated circuit.

14. The electronic assembly recited in claim 9, wherein the out-board edge of each terminal extends beyond the inner edge of the at least one indentation of the corresponding pad.

15. The electronic assembly recited in claim 9, wherein the perimeter has a geometric pattern from the group comprising a rectangle, a circle, an oval, a free-form pattern, or a combination of the foregoing.

16. The electronic assembly recited in claim 9, wherein each pad has an upper edge and a lower edge, and wherein each terminal of each component has an upper edge and a lower edge that are lined up with the upper edge and lower edge of the corresponding pad, respectively.

17. An electronic system comprising an electronic assembly having:
   a substrate having a plurality of sets of pads, each set of pads having an inter-pad region, each pad having a bonding region and a perimeter with at least one indentation therein facing away from the bonding region and having an inner edge; and
   an electric component mounted on each set of pads, the bonding region of each pad in a set being coupled to a respective terminal of the electric component, wherein each terminal has an out-board edge that extends in a direction away from the inter-pad region to at least the inner edge of the at least one indentation of the corresponding pad.

18. The electronic system recited in claim 17, wherein each set comprises two pads.

19. The electronic system recited in claim 17, wherein each pad comprises a plurality of indentations therein facing away from the bonding area and each having an inner edge, and wherein the out-board edge of each terminal extends in a direction away from the inter-pad region to at least the inner edges of the plurality of indentations of the corresponding pad.

20. The electronic system recited in claim 19 wherein for each pad the bonding region partially overlaps the inner edges of the plurality of indentations.

21. The electronic system recited in claim 19, wherein the out-board edge of each terminal extends beyond the inner edges of the plurality of indentations of the corresponding pad.

22. The electronic system recited in claim 17, wherein the component is from the group comprising a capacitor, inductor, resistor, fuse, transistor, and integrated circuit.

23. The electronic system recited in claim 17, wherein the out-board edge of each terminal extends beyond the inner edge of the at least one indentation of the corresponding pad.

24. The electronic system recited in claim 17, wherein the perimeter has a geometric pattern from the group comprising a rectangle, a circle, an oval, a free-form pattern, or a combination of the foregoing.

25. A method comprising:
   fabricating a plurality of sets of pads on a surface of a substrate, each set of pads having an inter-pad region, each pad having a bonding region and a perimeter;
   forming at least one indentation in the perimeter of each pad, the at least one indentation facing away from the bonding region and having an inner edge; and
   mounting a component on each set of pads, each pad in a set being coupled to a respective terminal of the component in the bonding region of the pad, wherein each terminal has an out-board edge that extends in a direction away from the inter-pad region to at least the inner edge of the at least one indentation of the corresponding pad.

26. The method recited in claim 25, wherein each set comprises two pads.

27. The method recited in claim 25, wherein forming comprises forming a plurality of indentations in the perimeter of each pad, each of the plurality of indentations facing away from the bonding region and having an inner edge.

28. The method recited in claim 27 wherein, in mounting, the out-board edge of each terminal extends beyond the inner edges of the plurality of indentations of the corresponding pad.

29. The method recited in claim 27 wherein, in fabricating, each pad has an upper edge and a lower edge, and wherein, in mounting, each terminal of each component has an upper edge and a lower edge that are lined up with the upper edge and lower edge of the corresponding pad, respectively.

30. The method recited in claim 25 wherein, in fabricating, the perimeter has a geometric pattern from the group comprising a rectangle, a circle, an oval, a free-form pattern, or a combination of the foregoing.

31. The method recited in claim 25 wherein, in mounting, the component is from the group comprising a capacitor, inductor, resistor, fuse, transistor, and integrated circuit.

32. The method recited in claim 25 wherein, in mounting, the out-board edge of each terminal extends beyond the inner edge of the at least one indentation of the corresponding pad.

* * * * *

UNITED STATES PATENT AND TRADEMARK OFFICE
CERTIFICATE OF CORRECTION

PATENT NO. : 6,566,611 B2
DATED : May 20, 2003
INVENTOR(S) : George Hsieh et al.

It is certified that error appears in the above-identified patent and that said Letters Patent is hereby corrected as shown below:

Column 2,
Line 44, delete "-" after "assembly".

Column 4,
Line 28, delete "electrieally" and insert -- electrically -- therefor.

Column 5,
Line 39, delete "an" and insert -- a -- therefor.

Column 8,
Line 62, delete "FHP1" and insert -- $F_{HP1}$ -- therefor.

Signed and Sealed this

Ninth Day of December, 2003

JAMES E. ROGAN
*Director of the United States Patent and Trademark Office*